United States Patent [19]
Takeuchi

[11] Patent Number: 6,021,670
[45] Date of Patent: Feb. 8, 2000

[54] SEMICONDUCTOR ACCELERATION DETECTING DEVICE WITH SHOCK ABSORBING STRUCTURE

[75] Inventor: Takanobu Takeuchi, Tokyo, Japan

[73] Assignee: Mitsubishi Denki Kabushiki Kaisha, Tokyo, Japan

[21] Appl. No.: 08/929,041

[22] Filed: Sep. 19, 1997

[30] Foreign Application Priority Data

Apr. 15, 1997 [JP] Japan .................................. 9-097189

[51] Int. Cl.⁷ .................................................... G01P 15/08
[52] U.S. Cl. .......................................... 73/493; 73/514.32
[58] Field of Search ................................ 73/493, 514.01, 73/514.16, 514.32, 514.33, 514.34, 514.35, 526; 257/696, 730

[56] References Cited

U.S. PATENT DOCUMENTS

| 5,394,751 | 3/1995 | Ishibashi | 73/756 |
| 5,604,363 | 2/1997 | Ichihashi | 73/514.32 |
| 5,616,954 | 4/1997 | Tobase | 257/668 |

FOREIGN PATENT DOCUMENTS

| 51-100556 | 9/1976 | Japan . |
| 3-125468 | 5/1991 | Japan . |
| 3-263862 | 11/1991 | Japan . |
| 4-130653 | 5/1992 | Japan . |
| 4-282870 | 10/1992 | Japan . |
| 8-032007 | 2/1996 | Japan . |

*Primary Examiner*—John E. Chapman

[57] ABSTRACT

Provided is a semiconductor acceleration detecting device capable of improving the impact resistance in handling the device singly with a relatively simple construction without providing any other member. The device is a semiconductor acceleration detecting device S1 having a construction in which a package body Pc formed by mounting an acceleration detecting semiconductor chip on a die pad and molding it with the lead terminal sections Tr of lead pins protruding outward is combined by bonding with a main body section Bd, so that the device is totally formed into an approximately rectangular parallelepiped shape comprised of a pair of first surfaces F1 from which the lead terminal sections are protruding, a pair of second surfaces F2 approximately perpendicular to a suspension lead, and a pair of third surfaces F3 approximately parallel to the die pad. Remaining suspension leads A1, B1 and C1 are made to protrude from the second surfaces F2, and at least one of the protruding remaining suspension leads A1, B1 and C1 is bent so that its leading end protrudes outwardly of the third surface F3.

3 Claims, 7 Drawing Sheets

SEMICONDUCTOR ACCELERATION DETECTING DEVICE WITH SHOCK ABSORBING STRUCTURE

BACKGROUND OF THE INVENTION

1. Field of the Invention

The present invention relates to a semiconductor acceleration detecting device mounted with a semiconductor chip for detecting an acceleration.

2. Description of the Prior Art

Conventionally, as a semiconductor acceleration detecting device (referred to appropriately as an acceleration detecting device or simply as a device hereinafter), there has been a known device in which a package body formed by mounting an acceleration detecting semiconductor chip on a die pad and molding it with the lead terminal sections of lead pins protruding outward is combined by bonding with a main body section having an acceleration detecting mass body as totally formed into an approximately rectangular parallelepiped shape (including a cube). In this case, the acceleration detecting device is totally formed into an approximately rectangular parallelepiped shape comprised of a pair of first surfaces from which the lead terminal sections are protruding, a pair of second surfaces which are approximately parallel to the lead terminal sections and approximately perpendicular to the die pad and a pair of third surfaces which are approximately parallel to the die pad.

The acceleration detecting device as described above is normally used as assembled into a unit body having a specified electric circuit and connected electrically and mechanically to the unit body via the lead terminal sections.

In the above acceleration detecting device, as described later, the acceleration detecting mass body assembled into the main body section is cantilevered by a thin beam, and this mass body swings when an acceleration is effected in a specified direction.

Then, the magnitude of the swing (i.e., the magnitude of the acceleration) of this mass body is detected and outputted as an electric signal. For the purpose of increasing the quantity of swing of the mass body due to the effect of the acceleration and increasing the detection accuracy and sensitivity, the thickness of the beam which supports the mass body is set to a very thin thickness.

For the above reasons, if the acceleration detecting device is handled not properly, e.g., it is dropped when handled, particularly in an assembling stage into the unit body, or in a preceding conveyance stage, and consequently an impact load in excess of a certain degree is applied to the acceleration detecting device due to the drop or the like, the beam for supporting the aforementioned mass body may be damaged.

To solve the above problem, a cushioning material may be attached to each of the surfaces other than the first surfaces from which the lead terminal sections of the acceleration detecting device protrude. However, in this case, a separate cushioning material is necessary, and it takes much time and labor for attaching the material to each required surface, causing the additional problem of higher cost.

Assuming that the mass of the mass body is M and the movement velocity of the acceleration detecting device in the impact effecting stage is V, then an impact force F applied to the beam for supporting the mass body is expressed by the following equation (1) as a product obtained by multiplying the mass M of the mass body by an acceleration $\Delta V/\Delta t$ (t: time).

$$F = M \cdot (\Delta V/\Delta t) \tag{1}$$

Therefore, in order to reduce the impact force F applied to the beam, it is required to reduce the mass M of the mass body or allow $\Delta t$ to be increased by easing the impact. In this case, the mass M of the mass body cannot be reduced for the purpose of maintaining the detection accuracy and sensitivity of the acceleration detecting device. Therefore, the above matter must be managed by increasing $\Delta t$.

When the acceleration detecting device receives an impact due to the drop thereof or the like and this impact is received by the first surface from which the lead terminal section protrudes, the impact force F exerted on the beam is reduced since the impact is eased by the lead terminal section protruding from the surface (i.e., since $\Delta t$ is increased).

However, since the other surfaces (second surface and third surface) are provided with nothing to ease the impact, a great impact force F is applied to the beam when the acceleration detecting device receives the impact by any of these surfaces. Therefore, these surfaces are also required to be provided with a cushioning member which protrudes from the surfaces and eases the impact.

In the case where the acceleration detecting device is dropped to collide with a floor surface or the like, the greatest impact force F is exerted on the beam when the acceleration detecting device two-dimensionally receives the drop impact and no rebound occurs when the device collides with the floor surface or the like (i.e., when the impact is received with one shock). In this case, the velocity V in the aforementioned equation (1) becomes zero in an extremely short time ($\Delta t=0$), when an intense impact force F is exerted on the beam.

However, when the acceleration detecting device once collides with the floor surface by, for example, a corner portion of the package, a rebound occurs and the device receives the impact in a plurality of times (i.e., with two or more shocks), meaning that $\Delta t$ in the aforementioned equation (1) can be increased by that much for the improvement of the impact resistance.

Therefore, when the surfaces (second surfaces and third surfaces) other than the first surface from which the lead terminal section of the acceleration detecting device protrudes are provided with protruding members which protrude from the surfaces and ease the impact, there must be a protrusion configuration, for promoting the occurrence of rebound without any drop impact received two-dimensionally i.e. two or more points of simultaneous impact for surfaces and/or protrusions of the device.

The die pad to be mounted with an acceleration detecting semiconductor chip is supported by a lead frame normally via suspension leads which extend in the direction perpendicular to the lead pins. The suspension leads are cut from the lead frame after being molded with the lead terminal sections of the lead pins protruding outward, when the suspension leads are cut normally along the outer wall of the package body so that a remaining suspension lead which remains as connected to the die pad is not exposed outwardly of the package.

However, when the remaining suspension lead is cut along the frame of the lead frame, the remaining suspension lead protrudes from the outer wall of the package body, and this remaining suspension lead can be utilized for effecting a shock absorbing effect on the surface.

In regard to the matter of protruding the remaining suspension lead outwardly of the package body, several prior art constructions, which do not intend to make the remaining suspension lead produce the shock absorbing effect, are disclosed in, for example, Japanese Patent Laid-Open Publication No. HEI 3-263862 (first prior art), Japanese Patent Laid-Open Publication No. HEI 4-130653 (second prior art) or Japanese Patent Laid-Open Publication No. HEI 8-32007 (third prior art), for the purpose of utilizing the remaining suspension lead as a power lead, as a means for improving the heat radiating performance of the package body or the like by exposing the remaining suspension lead from the outer wall of the package body.

Furthermore, since the main body section and the package body in which the acceleration detecting mass body is assembled is normally made of a resin material, and therefore, it is easy to provide a protrusion on a specified surface in the molding stage. It is possible to make such a protrusion produce the shock absorbing effect.

In regard to the provision of such a protrusion, a prior art construction, which do not intend to make the protrusion produce the shock absorbing effect, is disclosed in, for example, Japanese Patent Laid-Open Publication No. HEI 3-125468 (fourth prior art) in which a protrusion for temporarily fixing the package body on a board is provided on one surface side of the package body.

However, the constructions disclosed in the aforementioned prior art have the following problems in terms of the improvement of the impact resistance performance.

That is, according to the first prior art, the remaining suspension lead is drawn out of the package body as a heat radiating lead frame. In this case, the remaining suspension lead is arranged in a planar configuration such that it fits along a specified surface of the package body. When the device collides with the floor surface or the like due to the drop thereof or the like, it tends to two-dimensionally receive the drop impact, and the occurrence of rebound due to the remaining suspension lead is scarcely expected. Therefore, it is difficult to surely make the device receive the impact in the dropping stage in a plurality of times (i.e., with more two or more shocks), meaning that the impact resistance cannot be sufficiently improved. Furthermore, according to this first prior art, the remaining suspension lead is set widely so as to cover almost the entire specified surface of the package body, where the lead frame is very specific.

Furthermore, according to the second prior art, the remaining suspension lead is utilized as a power lead. In this case, the surfaces parallel to the die pad of the package body are provided with no shock absorbing mechanisms, and the leading ends of a pair of wide remaining suspension leads are bent and formed flatly with their quantities of protrusion regulated. In the case where the device is dropped with the flat portion facing down, the device tends to two-dimensionally receive the drop impact when it collides with the floor surface or the like. Therefore, when the device is dropped like this, it is scarcely expected to surely generate a rebound by the remaining suspension lead.

Furthermore, according to the third prior art, the remaining suspension lead is protruding outwardly of the package body as a heat radiating lead pin. Also, in this case, the leading ends of the remaining suspension leads are bent and formed flatly with the quantities of protrusion of them regulated for the mounting to the assembly body. In the case where the device is dropped with the flat portion facing down, it also tends to two-dimensionally receive the drop impact when it collides with the floor surface or the like. Therefore, when the device is dropped like this, it is scarcely expected to surely generate a rebound by the remaining suspension lead.

Furthermore, according to the fourth prior art, the resin protrusion is formed only on one surface side of the package body, meaning that all the six surfaces of the rectangular parallelepiped are not provided with a shock absorbing mechanism. Furthermore, the quantities of protrusion of a pair of resin protrusions are regulated for the temporary fixation of them on a board, and the device tends to two-dimensionally receive a drop impact when it is dropped in the direction in which the protrusion extends.

Accordingly, the present invention has been developed with an object for providing a semiconductor acceleration detecting device capable of improving the impact resistance when it is handled singly with a relatively simple construction without providing any other member.

SUMMARY OF THE INVENTION

To achieve the above object, according to a first aspect of the present invention, there is provided a semiconductor acceleration detecting device having a construction comprising a package body that includes a die pad supported by a lead frame via a suspension lead, a plurality of lead pins extending in opposite directions with interposition of the die pad in a direction perpendicular to the suspension lead, and an acceleration detecting semiconductor chip mounted on the die pad, the die pad is molded with lead terminal sections of the lead pins protruding outward is combined and to form the device by bonding with a main body section having an acceleration detecting mass body. The device is formed into an approximately rectangular parallelepiped shape comprised of a pair of first surfaces from which the lead terminal sections are protruding, a pair of second surfaces approximately perpendicular to the suspension lead and a pair of third surfaces approximately parallel to most parallel surfaces of the die pad. Remaining suspension leads connected to the die pad when the suspension leads are cut from the lead frame are made to protrude from the second surfaces, and at least one of the protruding remaining suspension leads is bent so that its leading end protrudes outwardly of the third surface.

Furthermore, according to a second aspect of the present invention, there is provided a semiconductor acceleration detecting device having a construction comprising a package body that includes a die pad supported by a lead frame via a suspension lead, a plurality of lead pins extending in opposite directions with interposition of the die pad in a direction perpendicular to the suspension lead, and an acceleration detecting semiconductor chip mounted on the die pad. The die pad is molded with lead terminal sections of the lead pins protruding outward and is combined to form the device by bonding with a main body section that is made of resin and has an acceleration detecting mass body. The device is formed into an approximately rectangular parallelepiped shape comprised of a pair of first surfaces from which the lead terminal sections are protruding, a pair of second surfaces approximately perpendicular to the suspension lead and a pair of third surfaces approximately parallel to major parallel surface of the die pad, wherein remaining suspension leads connected to the die pad when the suspension leads are cut from the lead frame are made to protrude from the second surfaces, and at least a specified third surface is provided with a protrusion which is integrated with the main body section or the package body and protrudes from its surface.

Furthermore, in the semiconductor acceleration detecting device according to the third aspect of the present invention, based on the semiconductor acceleration detecting device of the aforementioned first or second aspect of the present invention, only one remaining suspension lead is provided for the corresponding surface.

Furthermore, in the semiconductor acceleration detecting device according to the fourth aspect of the present invention, based on the semiconductor acceleration detecting device of the aforementioned first or second aspect of the present invention, a plurality of remaining suspension leads are provided for the corresponding surface, and the quantities of protrusion of the remaining suspension leads from the corresponding surface are set differently from each other.

Furthermore, in the semiconductor acceleration detecting device according to the fifth aspect of the present invention, based on the semiconductor acceleration detecting device of any of the aforementioned first through fourth aspects of the present invention, the remaining suspension lead is provided in a position displaced from the center of the corresponding surface.

Furthermore, in the semiconductor acceleration detecting device according to the sixth aspect of the present invention, based on the semiconductor acceleration detecting device of any of the aforementioned first through fifth aspects of the present invention, the remaining suspension lead is provided with a shock absorbing portion formed in a specified shape.

Furthermore, in the semiconductor acceleration detecting device according to the seventh aspect of the present invention, based on the semiconductor acceleration detecting device of any of the aforementioned first through sixth aspects of the present invention, at least the leading end portions of the remaining suspension leads are bent inward as formed into a curved shape.

Furthermore, according to the eighth aspect of the present invention, there is provided a semiconductor acceleration detecting device having a construction in which a package body formed by mounting an acceleration detecting semiconductor chip on a die pad and molding the die pad with lead terminal sections of lead pins protruding outward is combined by bonding with a main body section having an acceleration detecting mass body, the device being totally formed into an approximately rectangular parallelepiped shape comprised of a pair of first surfaces from which the lead terminal sections are protruding, a pair of second surfaces which are approximately parallel to the lead terminal sections and approximately perpendicular to the die pad and a pair of third surfaces which are approximately parallel to the die pad, wherein the second surfaces and at least a specified third surface are each provided with a protrusion which is integrated with the main body section or the package body and protrudes from their surfaces.

Furthermore, in the semiconductor acceleration detecting device according to the ninth aspect of the present invention, based on the semiconductor acceleration detecting device of the aforementioned second or eighth aspect of the present invention, not more than two protrusions are provided for one surface.

Furthermore, in the semiconductor acceleration detecting device according to the tenth aspect of the present invention, based on the semiconductor acceleration detecting device of the aforementioned second or eighth aspect of the present invention, not less than three protrusions are provided for one surface, and heights of the protrusions are set differently from one another.

Furthermore, in the semiconductor acceleration detecting device according to the eleventh aspect of the present invention, based on the semiconductor acceleration detecting device of the aforementioned second aspect or any of the eighth through tenth aspects of the present invention, the protrusion is provided in a position displaced from the center of the corresponding surface.

DETAILED DESCRIPTION OF THE PREFERRED EMBODIMENTS

Preferred embodiments of the present invention will be described in detail below with reference to the accompanying drawings.

(First Embodiment)

Figure 1:
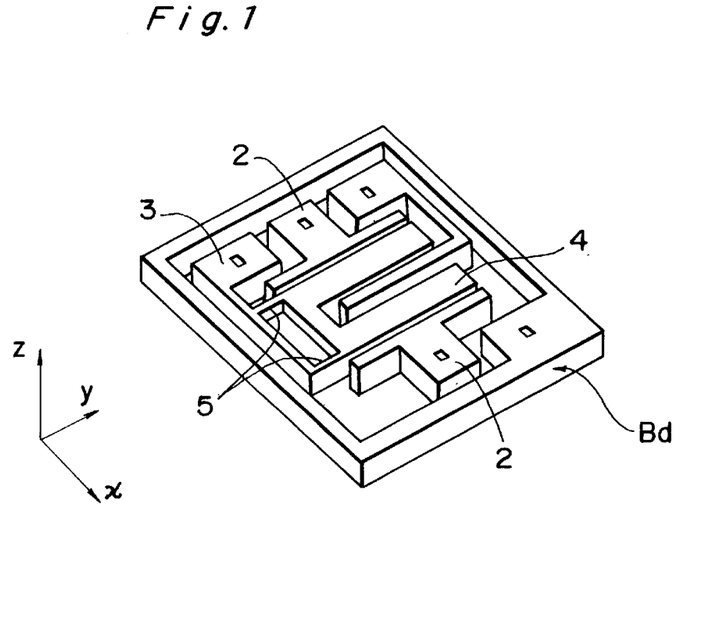
FIG. 1 is a perspective view showing the inside of the main body section of a semiconductor acceleration detecting device according to a first embodiment of the present invention.

FIG. 1 is a perspective view showing the inside of a main body section Bd of a semiconductor acceleration detecting device (referred to occasionally as an acceleration detecting device or simply as a device hereinafter) according to the present first embodiment. As shown in FIG. 1, the main body section Bd is provided with a fixed electrode 2 and an intermediate electrode 3, and to this intermediate electrode 3 is connected a mass body 4 having a specified mass via, for example, a pair of beams 5. It is to be noted that the main body section Bd is formed of a synthetic resin.

When an acceleration is applied in an x-direction in FIG. 1, the mass body 4 swings to vary a gap between the fixed electrode 2 and the intermediate electrode 3, so that the capacitance between both the electrodes varies. By detecting this variation of capacitance, the magnitude of the swing (i.e., the magnitude of the acceleration) of the mass body 4 is detected. For the purpose of increasing the quantity of swing of the mass body 4 due to the effect of the acceleration and increasing the detection accuracy and sensitivity, the thickness of each beam 5 is set to a very small thickness.

Figure 3:
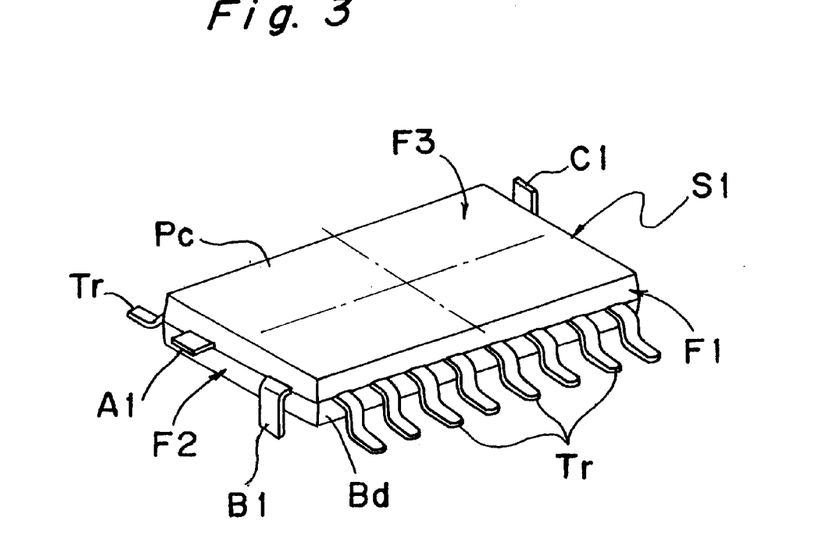
FIG. 3 is a perspective view of the semiconductor acceleration detecting device of the first embodiment.

As shown in FIG. 3, the main body section Bd constructed as above is combined with a package Pc made of resin to be integrated by, for example, bonding or welding, so that an approximately rectangular parallelepiped acceleration detecting device Si is formed.

The package Pc is internally provided with a built-in electric circuit (not shown) including a semiconductor chip, and the variation of capacitance between the fixed electrode 2 and the intermediate electrode 3 due to the swing of the mass body 4 is detected as an electric signal by this electric circuit, so that a signal can be outputted to the outside via lead terminals Tr. It is to be noted that the above basic construction is similar to those of the known prior arts.

Figure 2:
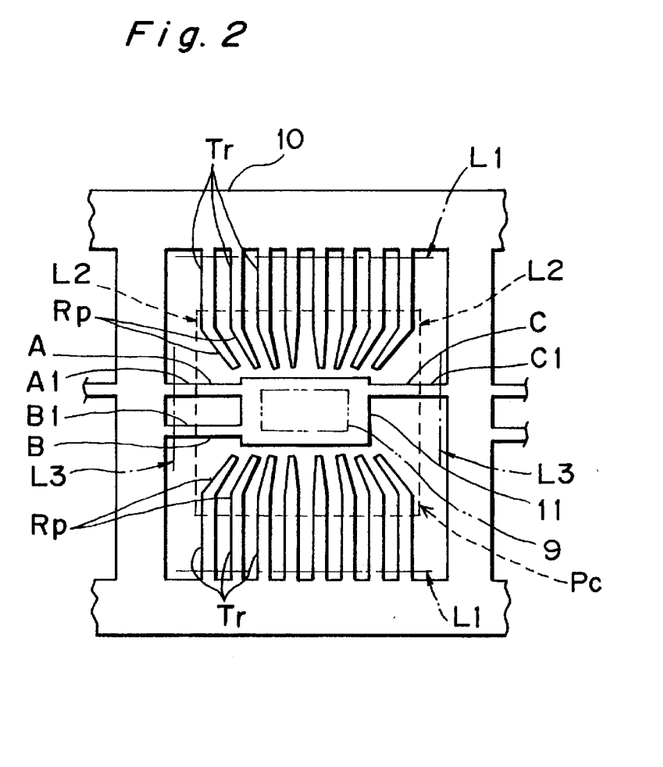
FIG. 2 is a plan view for explaining a lead frame for use in the semiconductor acceleration detecting device of the first embodiment.

FIG. 2 is a plan view for explaining a lead frame 10 provided with a die pad 11 for mounting a semiconductor chip 9 to be incorporated into the package Pc. As shown in this figure, the die pad 11 is placed in an approximate center position of the lead frame 10 and supported by the lead frame 10 via a plurality of (three in the example shown in FIG. 2) suspension leads A, B and C. Further, a number of lead pins Rp are extending in opposite directions with interposition of the die pad 11 in a direction perpendicular to the suspension leads A, B and C (in the vertical direction in FIG. 2).

After the semiconductor chip 9 for acceleration detection is mounted on the die pad 11 by means of, for example, bonding, the lead pins Rp are connected to the semiconductor chip 9 by means of, for example, bonding wires (not shown). Subsequently, by forming a mold by means of a specified resin material with the terminal sections Tr (lead terminals) of the lead pins Rp protruding outward, the aforementioned package Pc is formed (refer to the dashed lines in a rectangular shape in FIG. 2).

Next, the lead pins Rp and the suspension leads A, B and C are cut from the lead frame 10. The lead pins Rp are cut along one-dot chain lines L1 in FIG. 2. On the other hand, the suspension leads A, B and C are normally cut along dashed lines L2 in the vertical direction in FIG. 2 so that they are not exposed to the outside of the package Pc. However, according to the present embodiment, they are cut along one-dot chain lines L3 proximate to the lead frame 10. Therefore, when the suspension leads A, B and C are cut, remaining suspension leads A1, B1 and C1 which are left as connected to the die pad 11 protrude outwardly of the package Pc.

By combining the package Pc formed as described above with the main body section Bd by bonding, there is formed an acceleration detecting device S1 (see FIG. 3 and FIG. 4) having totally an approximately rectangular parallelepiped shape (including a cube) comprised of a pair of first surfaces F1 from which the lead terminals Tr are protruding, a pair of second surfaces F2 approximately perpendicular to the suspension leads A, B and C and a pair of third surfaces F3 approximately parallel to the die pad 11. According to the present first embodiment, it is preferred that the lead terminals Tr have their leading ends stepped downward in the figure and have their lower surfaces positioned lower than the third surface F3 located on the lower side.

Figure 4:
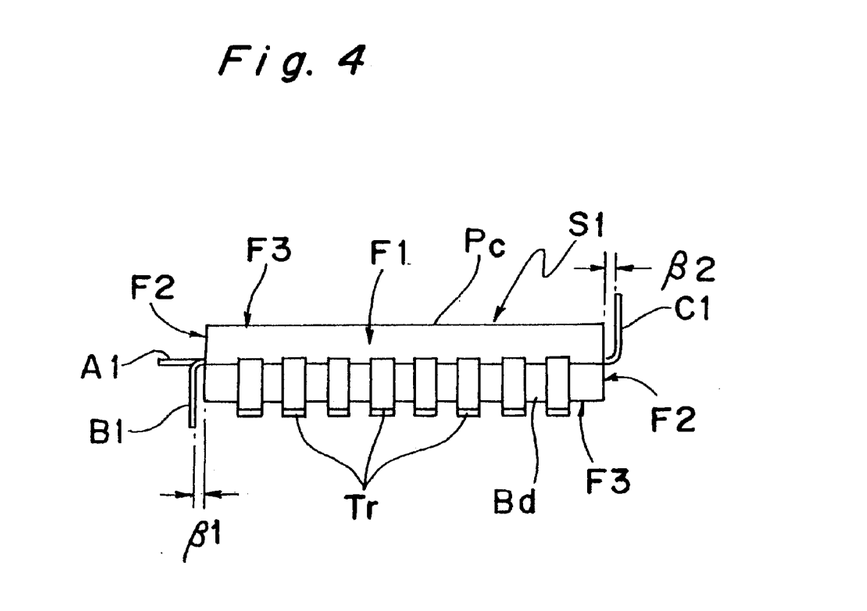
FIG. 4 is a side view of the semiconductor acceleration detecting device of the first embodiment.

According to the present first embodiment, the remaining suspension leads A1, B1 and C1 are made to protrude from the pair of second surfaces F2 which are approximately perpendicular to the suspension leads A, B and C, and at least one of the protruding remaining suspension leads A1, B1 and C1 (B1 and C1 in the present first embodiment) is bent so that its leading end is protruding outwardly of the third surface F3.

In this case, as clearly shown in FIG. 4, the remaining suspension leads B1 and C1 have their leading ends bent downward or upward in the figure in a state in which they are protruding from the second surfaces F2 by specified dimensions β1 and β2, respectively, and the protruding portions produce the shock absorbing effect on the second surfaces F2.

Therefore, the upper and lower third surfaces F3 are provided with respective ones of the remaining suspension leads B1 and C1, and the second surface F2 located on the right-hand side in FIG. 4 is provided with one remaining suspension lead C1. Further, the second surface F2 located on the left-hand side in FIG. 4 is provided with two remaining suspension leads A1 and B1. It is to be noted that the remaining suspension lead B1 for the third surface F3 located on the lower side is protruding downward from the lower end portions of the lead terminals Tr.

As described above, according to the present first embodiment, the remaining suspension leads A1, B1 and C1 are made to protrude from the second surfaces F2, and the remaining suspension leads B1 and C1 among the protruding remaining suspension leads A1, B1 and C1 are bent so that their leading ends protrude outwardly of the third surfaces F3. Therefore, in regard to the surfaces (second surfaces F2 and third surfaces F3) other than the pair of first surfaces F1 from which the lead terminals Tr are protruding, even when the acceleration detecting device S1 is dropped with one of these surfaces facing down, the device collides with the floor surface or the like by the remaining suspension leads A1, B1 and C1, their bent leading ends or corner portion, so that the impact is eased. Therefore, the device tends to receive the impact in a plurality of times (i.e., with two or more shocks) as a consequence of the occurrence of a rebound without two-dimensionally receiving the drop impact, and this allows Δt in the aforementioned equation (1) to be increased by that much.

That is, by utilizing the remaining suspension leads A, B and C of the lead frame 10, the second surfaces F2 and the third surfaces F3 can be provided with a shock absorbing mechanism without providing any other member, and this allows the impact resistance of the acceleration detecting device S1 to be improved when the device is handled singly with a relatively simple construction.

Particularly, in regard to the third surfaces F3, the third surfaces F3 are each provided with one of the remaining suspension leads B1 and C1 as described above. Therefore, when the acceleration detecting device S1 is dropped with the third surface facing down, the device collides with the floor surface or the like by the remaining suspension leads B1 and C1 or the corner portion.

For the purpose of constituting a plane, at least three points are required to be determined. In this regard, only one of the remaining suspension leads B1 and C1 is provided for the corresponding surface (third surfaces F3 on which the remaining suspension leads B1 and C1 operate as a shock absorbing mechanism). Therefore, it is difficult to determine a plane by three points including the leading end portion by virtue of the above arrangement. That is, the probability of two-dimensionally receiving the drop impact is reduced further than in the case where a number of remaining suspension leads are provided, so that the rebound can be made to occur with a higher probability, thereby allowing the impact resistance of the acceleration detecting device S1 to be improved.

Furthermore, in regard to the second surface F2 located on the right-hand side in FIG. 4 among the second surfaces F2, the remaining suspension lead C1 is protruding by the specified dimension β2, and this portion produces the shock absorbing effect. Therefore, this second surface F2 located on the right-hand side is provided with only one remaining suspension lead C1, meaning that it has an effect similar to that of the third surface F3 in terms of the impact resistance.

On the other hand, in regard to the second surface F2 located on the left-hand side in FIG. 4 among the second surfaces F2, the remaining suspension lead B1 is protruding by the dimension β1, and the remaining suspension lead A1 that is protruding straightly is provided. That is, the second surface F2 located on the left-hand side is provided with the two remaining suspension leads A1 and B1 of which the quantity of protrusion differs from each other.

Thus, the plurality of (two) remaining suspension leads A1 and B1 are provided for the corresponding surface (the second surface F2 located on the left-hand side), and the quantities of protrusion of the remaining suspension leads A1 and B1 from the second surface F2 located on the left-hand side are set differently from each other. Therefore, even when the plurality of remaining suspension leads A1 and B1 are provided for the corresponding surface F2, it is difficult to determine a plane by three points including their leading end portions by virtue of the above arrangement. That is, the probability of two-dimensionally receiving the drop impact is reduced further than in the case where the quantities of protrusion of the plurality of remaining suspension leads A1 and B1 are set equal to each other, so that the rebound can be made to occur with a higher probability when the acceleration detecting device S1 collides with the floor surface or the like, thereby allowing the impact resistance of the acceleration detecting device S1 to be improved.

Furthermore, according to the present first embodiment, each of the remaining suspension leads A1, B1 and C1 is provided in a position displaced from the center of the corresponding surface. When the acceleration detecting device S1 is dropped with its certain surface facing down, the device is to collide with the floor surface or the like normally by a portion displaced from the surface position of its center of gravity (center of the surface).

Therefore, the probability of two-dimensionally receiving the drop impact is reduced further than in the case where the remaining suspension leads A1, B1 and C1 are provided at the center of the corresponding surfaces, so that the rebound can be made to occur with a higher probability when the acceleration detecting device S1 collides with the floor surface or the like, thereby allowing the impact resistance of the acceleration detecting device S1 to be improved.

(Second Embodiment)

The second embodiment of the present invention will be described next. In the following description, the same components as those of the first embodiment are denoted by the same reference numerals, and no further description is provided for them.

Figure 5:
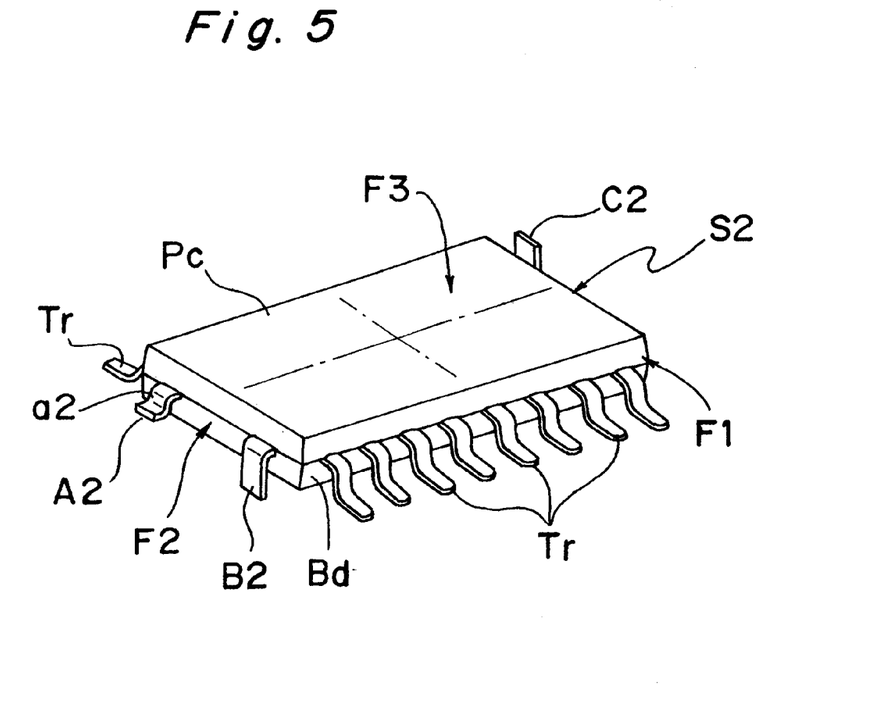
FIG. 5 is a perspective view of a semiconductor acceleration detecting device according to a second embodiment.

As shown in FIG. 5, an acceleration detecting device S2 according to the present second embodiment is provided with remaining suspension leads A2, B2 and C2 located in the same positions as those of the first embodiment. Among these, the remaining suspension leads B2 and C2 are the same as the remaining suspension leads B1 and C1 of the first embodiment.

On the other hand, the remaining suspension lead A2 extending sideward is provided with a stepped portion a2 located in the middle thereof as a shock absorbing portion formed in a specified shape. By virtue of the provision of such a stepped portion a2 (shock absorbing portion) in the middle of the remaining suspension lead A2, when the acceleration detecting device S2 collides with the floor surface or the like, the impact can be more effectively absorbed, thereby allowing the impact resistance of the acceleration detecting device S2 to be improved.

(Third Embodiment)

Figure 6:
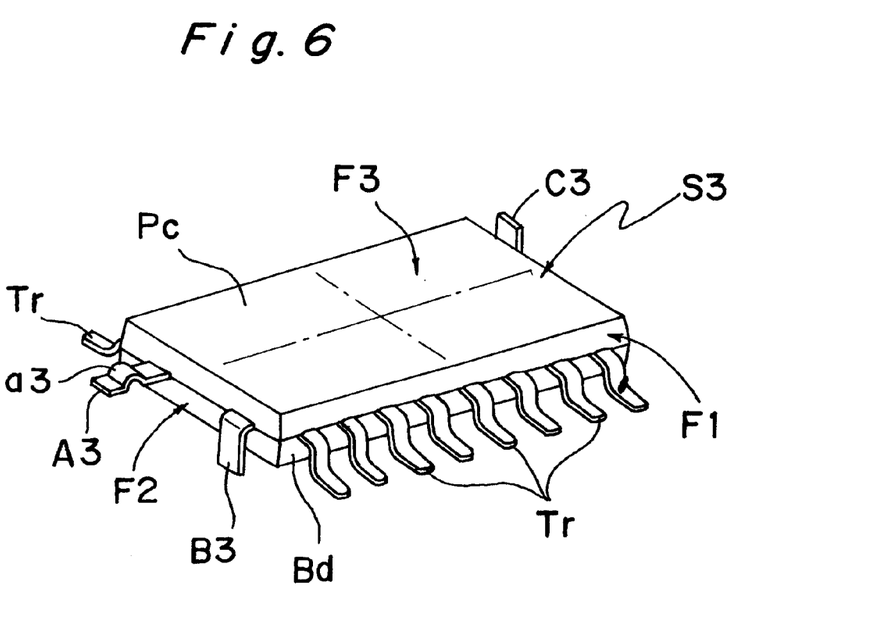
FIG. 6 is a perspective view of a semiconductor acceleration detecting device according to a third embodiment.

The third embodiment of the present invention will be described next. As shown in FIG. 6, an acceleration detecting device S3 according to the present third embodiment is the same as that of the first embodiment or the second embodiment except for a remaining suspension lead A3 extending sideward. That is, remaining suspension leads B3 and C3 are the same as the remaining suspension leads B1 and C1 of the first embodiment.

On the other hand, the remaining suspension lead A3 extending sideward, a looped portion a3 is provided in the middle thereof as a shock absorbing portion formed in a specified shape. The effect by virtue of the provision of this loop a3 is the same as that of the provision of the stepped portion a2 in the second embodiment.

(Fourth Embodiment)

Figure 7:
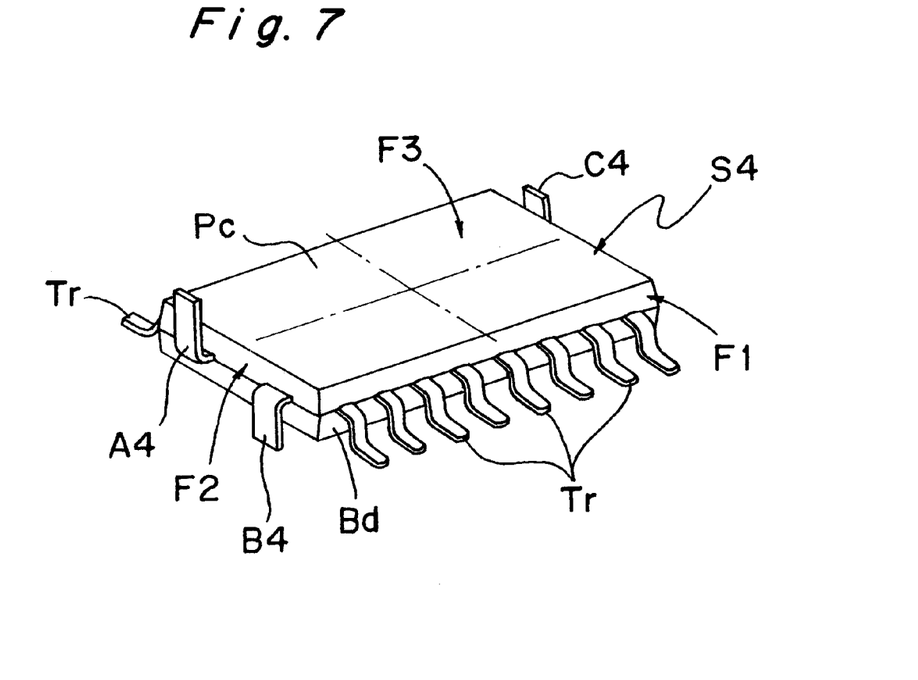
FIG. 7 is a perspective view of a semiconductor acceleration detecting device according to a fourth embodiment.
Figure 8:
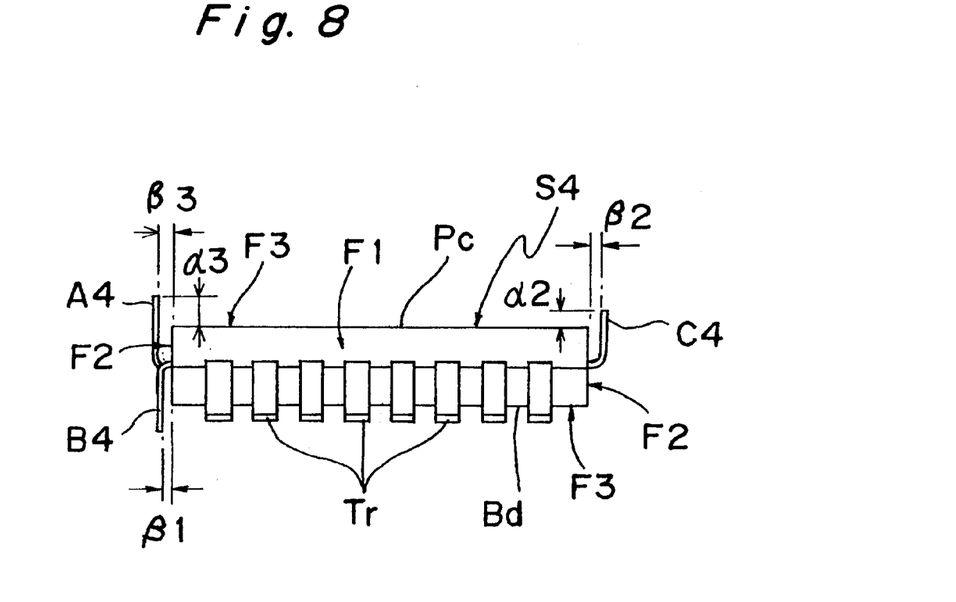
FIG. 8 is a side view of the semiconductor acceleration detecting device of the fourth embodiment.

The fourth embodiment of the present invention will be described next. As shown in FIGS. 7 and 8, an acceleration detecting device S4 according to the present fourth embodiment is the same as that of the first embodiment except for the arrangement that a remaining suspension lead A4 extending sideward is bent upward. That is, remaining suspension leads B4 and C4 are the same as the remaining suspension leads B1 and C1 of the first embodiment.

In this case, two remaining suspension leads A4 and C4 operate as a shock absorbing mechanism for the third surface F3 located on the upper side, however, the quantities of protrusion (α3 and α2) of them from the third surface F3 located on the upper side are set differently from each other. Further, in regard to the second surface F2 located on the left-hand side, the quantities of protrusion (β3 and β1) of the two remaining suspension leads A4 and B4 from the second surface F2 are set differently from each other.

The effect of the arrangement that the quantities of protrusion of the plurality of remaining suspension leads provided for each surface from the surface are set differently from each other is as described above.

(Fifth Embodiment)

Figure 9:
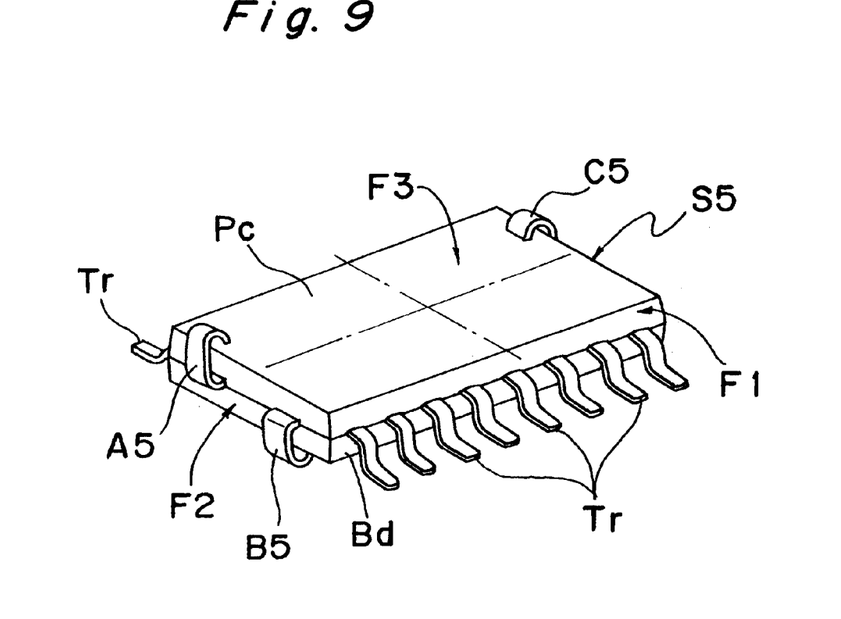
FIG. 9 is a perspective view of a semiconductor acceleration detecting device according to a fifth embodiment.

The fifth embodiment of the present invention will be described next. As shown in FIG. 9, in an acceleration detecting device S5 according to the present fifth embodiment, at least the leading end portions of remaining suspension leads A5, B5 and C5 are bent inward and formed in a curved shape, i.e., they are formed concretely in an approximately J-figured shape or C-figured shape as viewed from the side.

By thus forming the leading end portions of the remaining suspension leads A5, B5 and C5, the cut surfaces of the remaining suspension leads A5, B5 and C5 are not directed outward, so that a good handling of the acceleration detecting device S5 is ensured.

(Sixth Embodiment)

Figure 10:
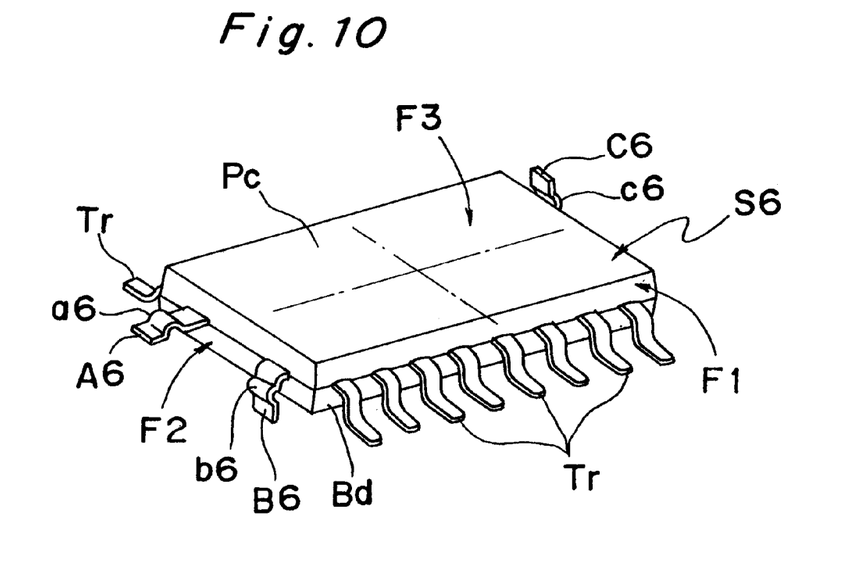
FIG. 10 is a perspective view of a semiconductor acceleration detecting device according to a sixth embodiment.

The sixth embodiment of the present invention will be described next. As shown in FIG. 10, in an acceleration detecting device S6 according to the present sixth embodiment, not only a remaining suspension lead A6 extending sideward is provided with a loop portion a6 which serves as a shock absorbing portion, but also remaining suspension leads B6 and C6 bent upward and downward are provided with loop portions b6 and c6, respectively. Therefore, the shock absorbing effect by the above loop portions b6 and c6 can be obtained for the third surfaces F3 located on the upper and lower sides.

(Seventh Embodiment)

Figure 11:
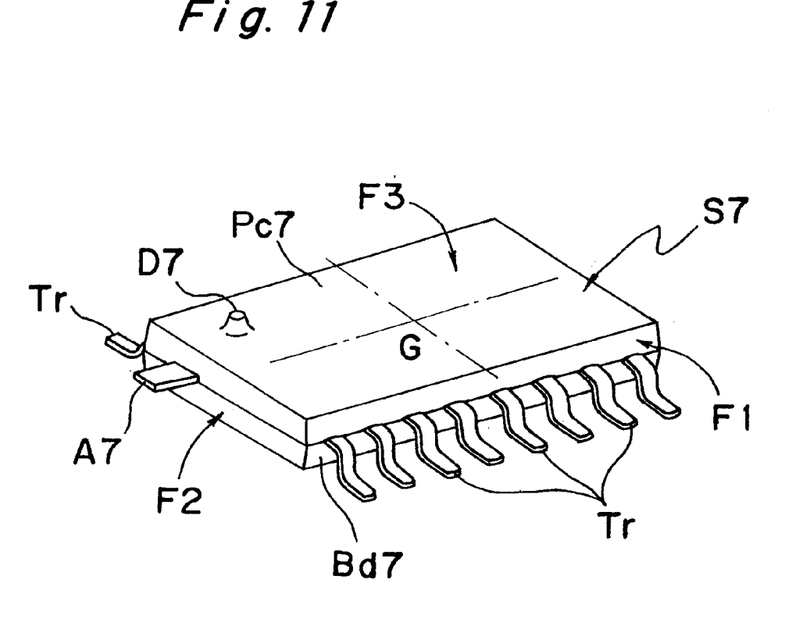
FIG. 11 is a perspective view of a semiconductor acceleration detecting device according to a seventh embodiment.

The seventh embodiment of the present invention will be described next. As shown in FIG. 11, in an acceleration detecting device S7 according to the present seventh embodiment, a remaining suspension lead A7 is made to protrude from the second surfaces F2, and the third surface F3 is provided with a protrusion D7 that is integrated with a main body section Bd7 or a package body section Pc7 and protrudes from the surface.

The third surface F3 located on the lower side is preferably provided with the above-mentioned protrusion D7, and its leading end portion is located below the lower end surfaces of the lead terminals Tr. Further, according to the present seventh embodiment, only one remaining suspension lead A7 is provided in a position displaced from the center of each second surface F2.

Therefore, in regard to the surfaces (second surfaces F2 and third surfaces F3) other than the pair of first surfaces F1 from which the lead terminals Tr are protruding, when the acceleration detecting device S7 is dropped with any of these surfaces F2 and F3 facing down, it collides with the floor surface or the like by the remaining suspension leads A7, the protrusion D7 or the corner portion, so that the impact is eased. Therefore, the device tends to receive the impact in a plurality of times (i.e., with two or more shocks) as a consequence of the occurrence of a rebound without two-dimensionally receiving the drop impact, and this allows Δt in the aforementioned equation (1) to be increased by that much.

That is, by utilizing the remaining suspension leads A, B and C of the lead frame 10 and the provision of the protrusion D7, the second surfaces F2 and the third surfaces F3 can be provided with a shock absorbing mechanism without providing any other member, and this allows the impact resistance of the acceleration detecting device S7 to be improved when the device is handled singly with a relatively simple construction.

Furthermore, in the present seventh embodiment, not more than two (one concretely) protrusions D7 are provided for one third surface F3, and therefore, it is difficult to determine a plane by three points including the leading end portion of the protrusion D7 by virtue of the above arrangement. That is, the probability of two-dimensionally receiving the drop impact is reduced further than in the case where three or more protrusions are provided, so that the rebound can be made to occur with a higher probability when the acceleration detecting device S7 collides with the floor surface or the like, thereby allowing the impact resistance of the acceleration detecting device S7 to be improved.

Furthermore, according to the present seventh embodiment, the protrusion D7 is provided in a position displaced from the center of the corresponding surface F3. Therefore, when the acceleration detecting device S7 is dropped with the surface F3 facing down, the device is to collide with the floor surface or the like by a portion displaced from the surface position of its center of gravity (center of the surface).

Therefore, the probability of two-dimensionally receiving the drop impact is reduced further than in the case where the protrusion D7 is provided at the center of the surface F3, so that the rebound can be made to occur with a higher probability when the acceleration detecting device S7 collides with the floor surface or the like, thereby allowing the impact resistance of the acceleration detecting device S7 to be improved.

(Eighth Embodiment)

Figure 12:
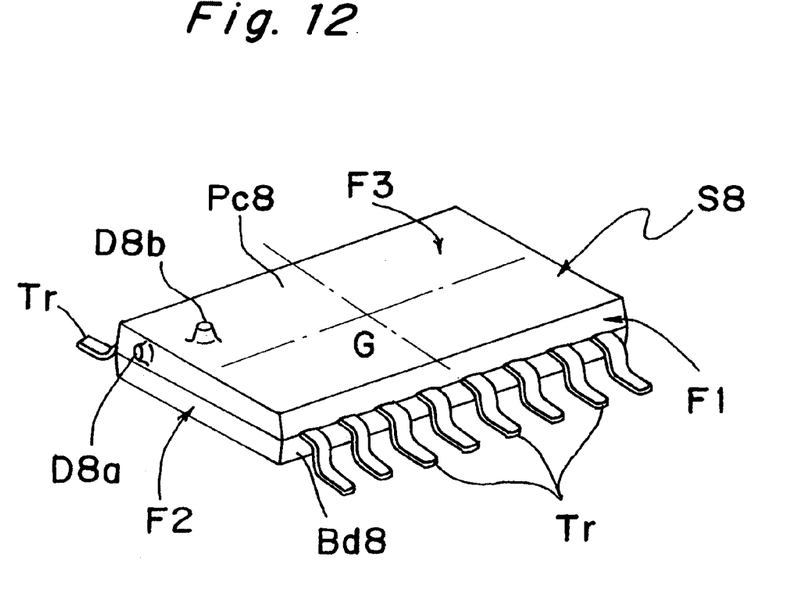
FIG. 12 is a perspective view of a semiconductor acceleration detecting device according to an eighth embodiment.

The eighth embodiment of the present invention will be described next. As shown in FIG. 12, in an acceleration detecting device S8 according to the present eighth embodiment, the second surfaces F2 and at least a specified third surface F3 (preferably both the third surfaces F3 in the present embodiment) are provided with protrusions D8a and D8b which are integrated with a main body section Bd8 or a package body section Pc8 and protrude from the surfaces.

Since the main body section Bd8 and the package body section Pc8 are each made of resin, it is easy to provide the specified surfaces with the protrusions D8a and D8b as described above when they are formed.

Therefore, in regard to the surfaces (second surfaces F2 and third surfaces F3) other than the pair of first surfaces F1 from which the lead terminals Tr are protruding, when the acceleration detecting device S8 is dropped with any of these surfaces facing down, the device collides with the floor surface or the like by the protrusion D8a, D8b or the corner portion, so that the impact is eased. Therefore, the device tends to receive the impact in a plurality of times (i.e., with two or more shocks) as a consequence of the occurrence of a rebound without two-dimensionally receiving the drop impact, and this allows Δt in the aforementioned equation (1) to be increased by that much.

That is, by virtue of the provision of the protrusions D8a and D8b, the second surfaces F2 and the third surfaces F3 can be provided with a shock absorbing mechanism without providing any other member, and this allows the impact resistance of the acceleration detecting device S8 to be improved when the device is handled singly with a relatively simple construction.

Furthermore, also in the present eighth embodiment, the second surfaces F2 and the third surfaces F3 are each provided with only one of the protrusions D8a and D8b located in a position displaced from the center thereof.

(Ninth Embodiment)

Figure 13:
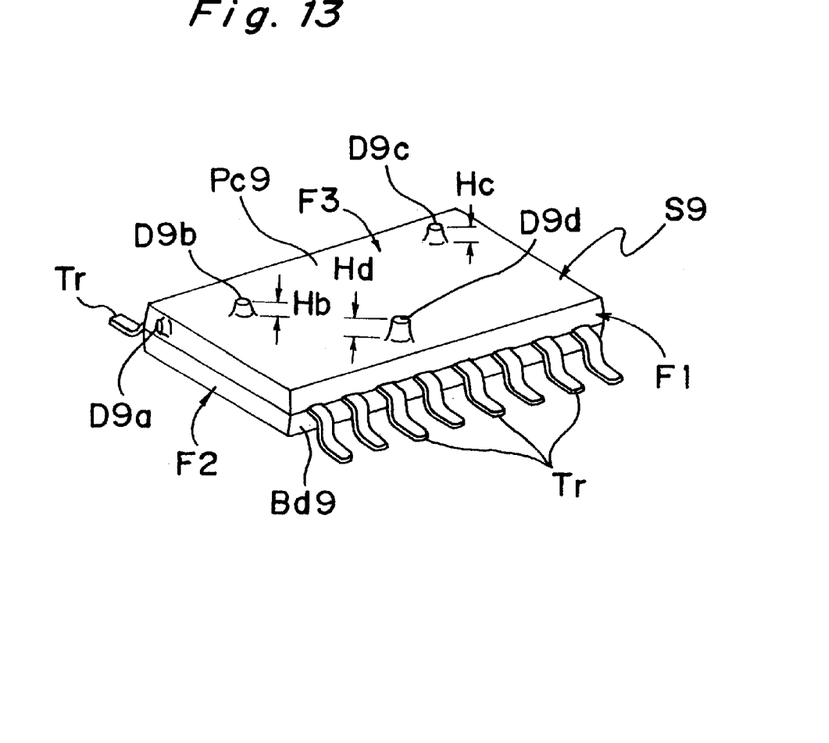
FIG. 13 is a perspective view of a semiconductor acceleration detecting device according to a ninth embodiment.

The ninth embodiment of the present invention will be described next. As shown in FIG. 13, in an acceleration detecting device S9 according to the present ninth embodiment, the second surfaces F2 and at least a specified third surface F3 (preferably both the third surfaces F3 in the present embodiment) are provided with a protrusion D9a and protrusions D9b, D9c and D9d which are integrated with a main body section Bd9 or a package Pc9 and protrude from the surfaces.

Then, in the present ninth embodiment, three protrusions D9b, D9c and D9d are provided on the third surface F3, and the heights Hb, Hc and Hd of the protrusions D9b, D9c and D9d are set differently from one another.

Since the heights Hb, Hc and Hd of the protrusions D9b, D9c and D9d are different from one another, even when three or more protrusions are provided on one surface, it is difficult to determine a plane by three points including the leading end portions of these protrusions by virtue of the above arrangement. Therefore, the probability of two-dimensionally receiving the drop impact is reduced further than in the case where the heights of these three protrusions are set equal to one another, so that the rebound can be made to occur with a higher probability when the acceleration detecting device S9 collides with the floor surface or the like, thereby allowing the impact resistance of the acceleration detecting device S9 to be improved.

Figure 14:
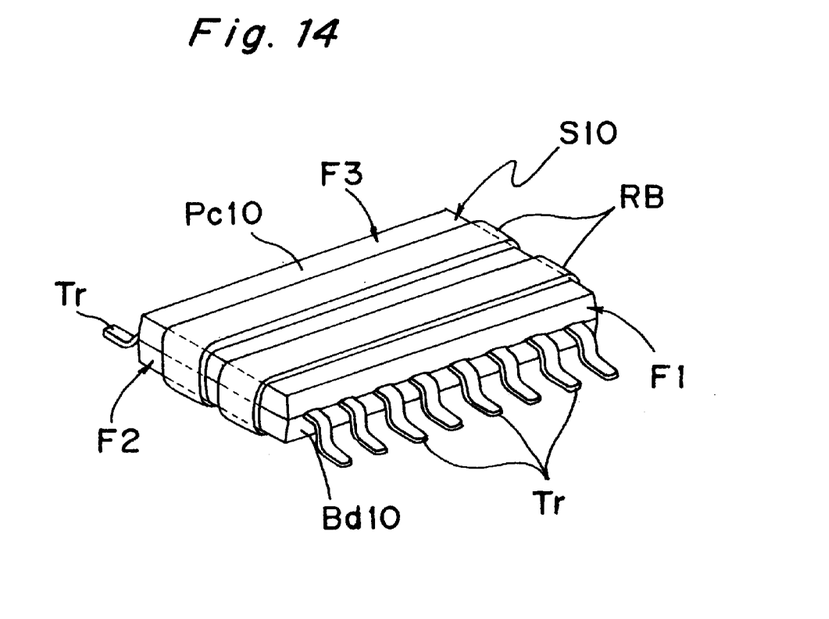
FIG. 14 is a perspective view of a semiconductor acceleration detecting device of which the shock absorbing is carried out by a belt-shaped elastic member.

An acceleration detecting device S10 as shown in FIG. 14 has a construction in which belt-shaped elastic members RB made of, for example, rubber are wound around a main body section Bd10 and a package Pc10, so that the second surfaces F2 and the third surfaces F3 are covered with the above elastic members RB. In this case, the impact occurring when the acceleration detecting device S10 is dropped on the floor surface or the like is eased by the shock absorbing effect of the elastic members RB.

Effect of the Invention

According to the first aspect of the present invention, the remaining suspension leads are made to protrude from the second surfaces F2 and at least one of the protruding remaining suspension leads is bent so that the leading end protrudes outwardly of the third surface F3. With this arrangement, in regard to the surfaces (second surfaces and third surfaces) other than the pair of first surfaces from which the lead terminals Tr are protruding, when the acceleration detecting device is dropped with any of these surfaces facing down, the device collides with the floor surface or the like by the remaining suspension leads, the bent leading ends or the corner portion, so that the impact is eased. Therefore, the device tends to receive the impact in a plurality of times (i.e., with two or more shocks) as a consequence of the occurrence of a rebound without two-dimensionally receiving the drop impact, and this allows Δt in the aforementioned equation (1) to be increased by that much.

That is, by utilizing the remaining suspension leads of the lead frame, the second surfaces and the third surfaces can be provided with a shock absorbing mechanism without providing any other member, and this allows the impact resistance of the semiconductor acceleration detecting device to be improved when the device is handled singly with a relatively simple construction.

Furthermore, according to the second aspect of the present invention, the remaining suspension leads are made to protrude from the second surfaces, and the third surface is provided with the protrusion that is integrated with the main body section or the package body section and protrudes from the surface. Therefore, in regard to the surfaces (second surfaces and third surfaces) other than the pair of first surfaces from which the lead terminals Tr are protruding, when the acceleration detecting device is dropped with any of these surfaces facing down, the device collides with the floor surface or the like by the remaining suspension leads, the protrusion or the corner portion, so that the impact is eased. Therefore, the device tends to receive the impact in a plurality of times (i.e., with two or more shocks) as a consequence of the occurrence of a rebound without two-dimensionally receiving the drop impact, and this allows Δt in the aforementioned equation (1) to be increased by that much.

That is, by utilizing the remaining suspension leads of the lead frame and by virtue of the provision of the protrusion, the second surfaces and the third surfaces can be provided with a shock absorbing mechanism without providing any other member, and this allows the impact resistance of the semiconductor acceleration detecting device to be improved when the device is handled singly with a relatively simple construction.

Furthermore, according to the third aspect of the present invention, basically the same effect as that of the first or second aspect of the present invention can be produced. Furthermore, only one remaining suspension lead is provided for the corresponding surface (i.e., the surface on which the remaining suspension lead effects as a shock absorbing mechanism). Therefore, when the acceleration detecting device is dropped with the surface facing down, the device collides with the floor surface or the like by the remaining suspension lead or the corner portion.

It is required to determine three points for the construction of a plane, however, only one remaining suspension lead is provided for the corresponding surface. Therefore, it is difficult to determine a plane by three points including its leading end portion by virtue of the above arrangement. That is, the probability of two-dimensionally receiving the drop impact is reduced further than in the case where a plurality of remaining suspension leads are provided, so that the rebound can be made to occur with a higher probability when the acceleration detecting device collides with the floor surface or the like, thereby allowing the impact resistance of the acceleration detecting device to be improved.

Furthermore, according to the fourth aspect of the present invention, basically the same effect as that of the first or second aspect of the present invention can be produced. Furthermore, a plurality of remaining suspension leads are provided for the corresponding surface (surface on which the remaining suspension leads operate as a shock absorbing mechanism), and the quantities of protrusion of the remaining suspension leads from the corresponding surface are set differently from one another. Therefore, even when the plurality of remaining suspension leads are provided for the corresponding surface, it is difficult to determine a plane by three points including their leading end portions by virtue of the above arrangement. That is, the probability of two-dimensionally receiving the drop impact is reduced further than in the case where the quantities of protrusion of the plurality of remaining suspension leads are set equal to one another, so that the rebound can be made to occur with a higher probability when the acceleration detecting device collides with the floor surface or the like, thereby allowing the impact resistance of the acceleration detecting device to be improved.

Furthermore, according to the fifth aspect of the present invention, basically the same effect as that of any of the first through fourth aspects of the present invention can be produced. Furthermore, the remaining suspension leads are each provided in a position displaced from the center of the corresponding surface. Therefore, when the acceleration detecting device is dropped with the surface facing down, the device is to collide with the floor surface or the like by a portion displaced from the surface position of its center of gravity (center of the surface).

Therefore, the probability of two-dimensionally receiving the drop impact is reduced further than in the case where each remaining suspension lead is provided at the center of the corresponding surface, so that the rebound can be made to occur with a higher probability when the acceleration detecting device collides with the floor surface or the like, thereby allowing the impact resistance of the acceleration detecting device to be improved.

Furthermore, according to the sixth aspect of the present invention, basically the same effect as that of any of the first through fifth aspects of the present invention can be produced. Furthermore, the remaining suspension lead is provided with a shock absorbing portion formed in a specified shape. Therefore, when the acceleration detecting device collides with the floor surface or the like by this remaining suspension lead, the impact can be more effectively absorbed, thereby allowing the impact resistance of the acceleration detecting device to be improved.

Furthermore, according to the seventh aspect of the present invention, basically the same effect as that of any of the first through sixth aspects of the present invention can be produced. Furthermore, at least the leading end portions of remaining suspension leads are bent inward as formed into a curved shape. Therefore, the cut surfaces of the remaining suspension leads are not directed outward, so that a good handling of the acceleration detecting device is ensured.

Furthermore, according to the eighth aspect of the present invention, the second surfaces and at least a specified third surface are provided with protrusions which are integrated with the main body section or the package body section and protrude from the surfaces. Therefore, in regard to the surfaces (second surfaces and third surfaces) other than the pair of first surfaces from which the lead terminals are protruding, when the acceleration detecting device is dropped with any of these surfaces facing down, the device collides with the floor surface or the like by the protrusions or the corner portion, so that the impact is eased. Therefore, the device tends to receive the impact in a plurality of times (i.e., with two or more shocks) as a consequence of the occurrence of a rebound without two-dimensionally receiving the drop impact, and this allows Δt in the aforementioned equation (1) to be increased by that much.

That is, by virtue of the provision of the protrusions, the second surfaces and the third surfaces can be provided with a shock absorbing mechanism without providing any other member, and this allows the impact resistance of the acceleration detecting device to be improved when the device is handled singly with a relatively simple construction.

Furthermore, according to the ninth aspect of the present invention, basically the same effect as that of the second or eighth aspect of the present invention can be produced. Furthermore, not more than two protrusions are provided for one surface, and therefore, it is difficult to determine a plane by three points including the leading end portions of the protrusions by virtue of the above arrangement. That is, the probability of two-dimensionally receiving the drop impact is reduced further than in the case where three or more protrusions are provided, so that the rebound can be made to occur with a higher probability when the acceleration detecting device collides with the floor surface or the like, thereby allowing the impact resistance of the acceleration detecting device to be improved.

Furthermore, according to the tenth aspect of the present invention, basically the same effect as that of the second or eighth aspect of the present invention can be produced. Furthermore, three or more protrusions are provided for one surface, and the heights of the protrusions are set differently from one another. Therefore, even when three protrusions are provided for one surface, it is difficult to determine a plane by three points including the leading end portions of these protrusions by virtue of the above arrangement. Therefore, the probability of two-dimensionally receiving the drop impact is reduced further than in the case where the heights of these three or more protrusions are set equal to one another, so that the rebound can be made to occur with a higher probability when the acceleration detecting device collides with the floor surface or the like, thereby allowing the impact resistance of the acceleration detecting device to be improved.

Furthermore, according to the eleventh aspect of the present invention, basically the same effect as that of the second aspect or any of the eighth through tenth aspects of the present invention can be produced. Furthermore, each protrusion is provided in a position displaced from the center of the corresponding surface. Therefore, when the acceleration detecting device is dropped with the surface facing down, the device is to collide with the floor surface or the like by a portion displaced from the surface position of its center of gravity (center of the surface).

Therefore, the probability of two-dimensionally receiving the drop impact is reduced further than in the case where the protrusion is provided at the center of the corresponding surface, so that the rebound can be made to occur with a higher probability when the acceleration detecting device collides with the floor surface or the like, thereby allowing the impact resistance of the acceleration detecting device to be improved.

What is claimed is:

1. A semiconductor acceleration detecting device comprising a molded package body comprising:

a die pad supported by a lead frame via suspension leads, during the initial assembly of the device, a plurality of lead pins extending in opposite directions with interposition of said die pad in a direction generally perpendicular to the suspension leads and having lead terminal sections, an acceleration detecting semiconductor chip mounted on said die pad with the lead terminal sections of the lead pins protruding outward, and a main body section having an acceleration detecting mass body, the device being totally formed into an approximately rectangular parallelepiped shape comprised of a pair of first surfaces from which said lead terminal sections are protruding, a pair of second surfaces approximately perpendicular to said suspension leads and a pair of third surfaces approximately parallel to major parallel surfaces of said die pad;

said second surfaces and at least a specified one of the third surfaces being provided with at least one protrusion integrally formed with, and extending from, the corresponding surfaces, and if the number of protrusions for any given surface of the package body is greater than one, the respective protrusions for that given surface extend different distances from that surface to thereby decrease the probability of simultaneous engagement with the ground or the like at two or more spaced points of impact if the package is dropped.

2. The semiconductor acceleration detecting device of claim 1, wherein the second surfaces and specified third surface each have two protrusions.

3. The semiconductor acceleration detecting device of claim 1, wherein the second surfaces and specified third surface each have three protrusions.

* * * * *